United States Patent [19]

Sano et al.

[11] Patent Number: 4,845,668
[45] Date of Patent: Jul. 4, 1989

[54] VARIABLE FIELD CONTENT ADDRESSABLE MEMORY

[75] Inventors: Jun-ichi Sano, Chelmsford; Edward T. Lewis, Sudbury, both of Mass.

[73] Assignee: Raytheon Company, Lexington, Mass.

[21] Appl. No.: 131,474

[22] Filed: Dec. 10, 1987

[51] Int. Cl.[4] .............................................. G11C 15/00
[52] U.S. Cl. .................................. 365/49; 364/200; 364/900
[58] Field of Search .................. 365/49; 364/200, 900

[56] References Cited

U.S. PATENT DOCUMENTS

| | | | |
|---|---|---|---|
| 3,253,265 | 5/1966 | Lindquist | 365/49 |
| 3,329,937 | 7/1967 | Lewin | 365/49 |
| 4,523,301 | 6/1985 | adota et al. | 365/49 |

OTHER PUBLICATIONS

Preliminary Data Sheet for "VHSIC Window Addressable Memory (WAM)" by TRW Electronic Systems Group, 1986.
Hanna, Craig A., "The Associative Comparator: New Horizons in Electronic Defense", Technical Directions Federal Systems Division by IBM, vol. 9, No. 2, 1983.

*Primary Examiner*—Terrell W. Fears
*Attorney, Agent, or Firm*—Walter F. Dawson; Richard M. Sharkansky

[57] ABSTRACT

A variable field content addressable memory (VFCAM) unit cell comprises a 4-bit content addressable memory, a programmer and a field selector. A limited capability of comparing between limits is provided by using mask bits at the data line inputs to the VFCAM unit cell. A plurality of VFCAM unit cells may be cascaded vertically and horizontally to provide a Y words by X bits VFCAM array. The VFCAM array is programmable by a field code coupled to field partition logic which selects the same number of fields in all memory locations and the number of bits in each field, and an operational VFCAM system results when the VFCAM array is coupled to an input address decoder, an I/O register and an output encoder.

14 Claims, 8 Drawing Sheets

VARIABLE FIELD CONTENT ADDRESSABLE MEMORY

BACKGROUND OF THE INVENTION

This invention relates to a content addressable memory (CAM) and more particularly to a new programmable variable field content addressable memory.

A content addressable memory is a memory device wherein data is stored in memory word locations and a search word is simultaneously compared with all stored data words. When a match occurs between the search word and the stored data word or words, a match signal is generated. If a match for only a portion of a stored data word is desired, masking techniques are employed, but this results in a considerable waste of storage bits because of the fixed width of a storage word location.

A window addressable memory (WAM) is a memory device which stores a plurality of windows having a plurality of user-selected fields. During operation the WAM produces a pointer indicating which windows if any bound an input data word. To be considered within a window, all fields of the input word must be less than the upper limits and greater than the lower limits of the window. The output of a WAM device is a match signal indicating that the word presented to the input fell into one of the windows. The address of the matched word may be read-out. When multiple matches occur, a priority scheme is used to allow addresses to be read out sequentially. WAM devices may be connected together to make a larger WAM memory system. However, the WAM is only metalization mask programmable for selecting field boundaries before fabrication, and although masking may be used to essentially change a field of size, this approach wastes bits.

A CAM may be modified to perform a compare between limit operation on input data. However, such an operation requires additional comparator and arithmetic circuitry which consumes considerable semiconductor chip area.

An associative comparator (AC) is a device (developed by IBM, Federal Systems Division, Manassas, Virginia) which compares an input operand associatively (i.e. all operation simultaneously) with the entire contents of a limit memory. An AC chip compares two 16-bit parameters to 32 sets of upper and lower limits and generates a 5-bit match address. Each of the two parameter compares for each of the 32 compare cells can be independently programmed for compare within limits or compare outside limits. Each compare cell can be independently enabled or disabled and either of the two parameters can be globally disabled, that is, disregarded for all 32 compare cells. Several AC devices can be cascaded horizontally to accommodate any number of parameters, and vertically to provide any number of compare cells. The match readout circuitry is pipelined so that it can read out matches from a previous comparison while the current comparison is in progress. However, an AC device does not have the ability to change the location of a field boundary.

SUMMARY OF THE INVENTION

In accordance with the present invention, a variable field content addressable memory (VFCAM) cell is provided comprising a memory means having at least one storage bit for storing a data word or a portion of the data word, each storage bit being coupled to a word select line and a data line, means coupled to the memory means for determining the size of at least one field or portion of the field in the memory means corresponding to a field in the data word in response to a field partition signal and a field selector means coupled to the field size determining means for directing a match signal from the memory means to a field output line in response to field decode signals. The memory means comprises a comparator coupled to each storage bit for producing the match signal when each data line of a search word compares with a corresponding bit of the data word stored in the memory means.

In accordance with the present invention, a VFCAM array is provided comprising a plurality of VFCAM cells coupled together vertically and horizontally to form an array of Y words by X bits of memory storage locations. A terminator means is coupled to each unused field output line of the VFCAM array to establish a known logic state.

The present invention further provides a VFCAM system comprising memory array means for storing a plurality of data words in storage locations, each of the storage locations having the same partitioning for one or more fields, the fields corresponding to fields of said data words, address decoder means coupled to the memory array means for accessing each of the storage locations in the memory array means in response to an address input, means for transferring data to and from the memory array means in accordance with the address input, field partition means coupled to the memory array means for selecting the number of fields in each of the storage locations of the array means and the number of bits in each of the fields in response to a field code, and encoding means coupled to an output of said memory array means for generating an address for each of said fields within said stored data words.

In accordance with a further feature of the invention, a method is provided of programming a VFCAM system comprising the steps of transferring data to and from a memory array means in accordance with an address input, storing a plurality of data words in the memory array means of the memory system, the data words having fields corresponding to the memory system field partitioning, selecting the same number of fields in each of the storage locations of the memory array means and the number of bits in each of the fields by a field partition means in response to a programmable field code, and generating an address for each of the fields within the stored data words by encoding means coupled to an output of said memory array means.

BRIEF DESCRIPTION OF THE DRAWINGS

Other and further features of the invention will become apparent in connection with the accompanying drawings wherein.

DESCRIPTION OF THE PREFERRED EMBODIMENT

Figure 1:
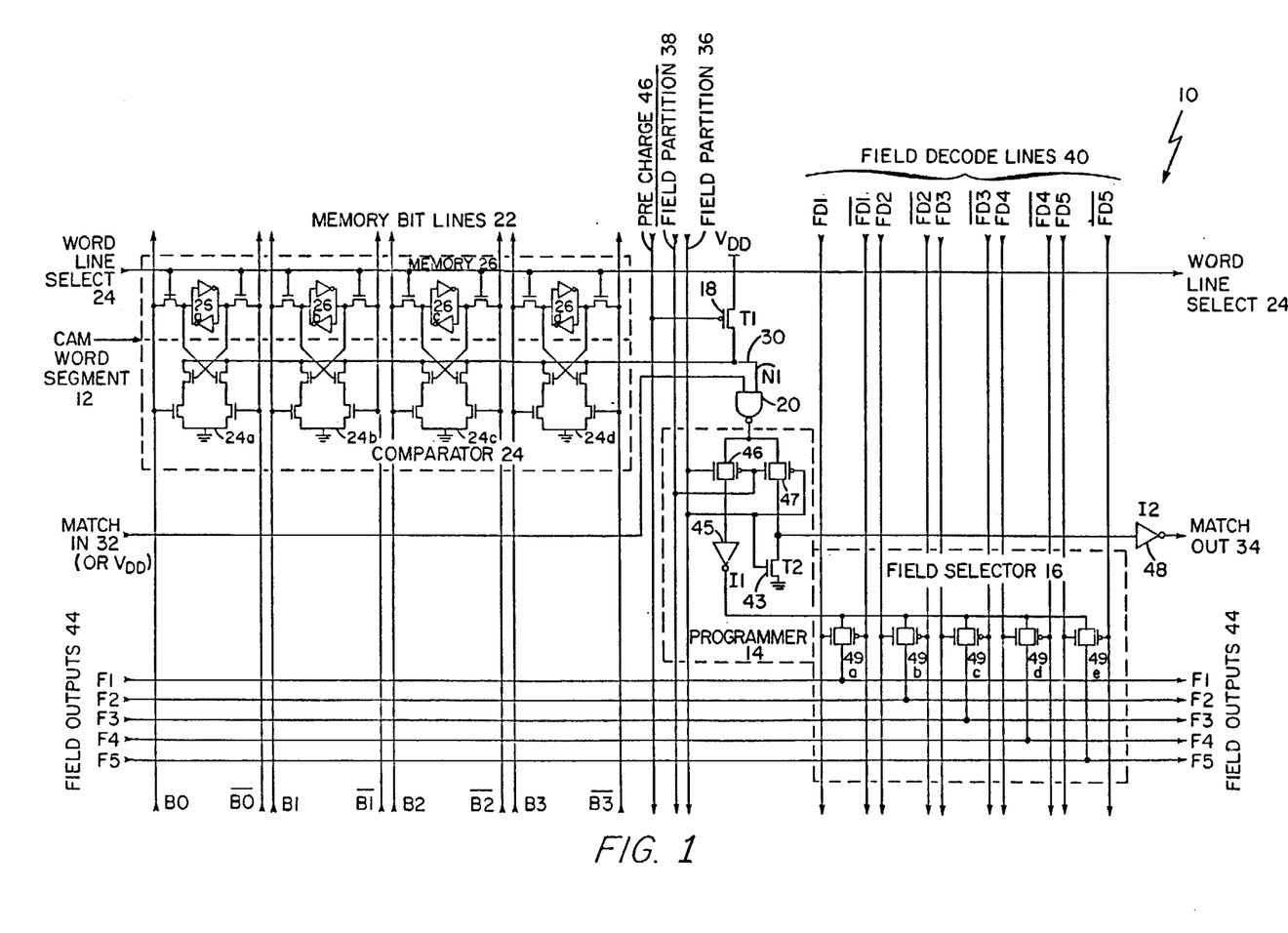
FIG. 1 is a schematic diagram of the present invention showing a 4-bit variable field CAM unit cell.
Figure 2:
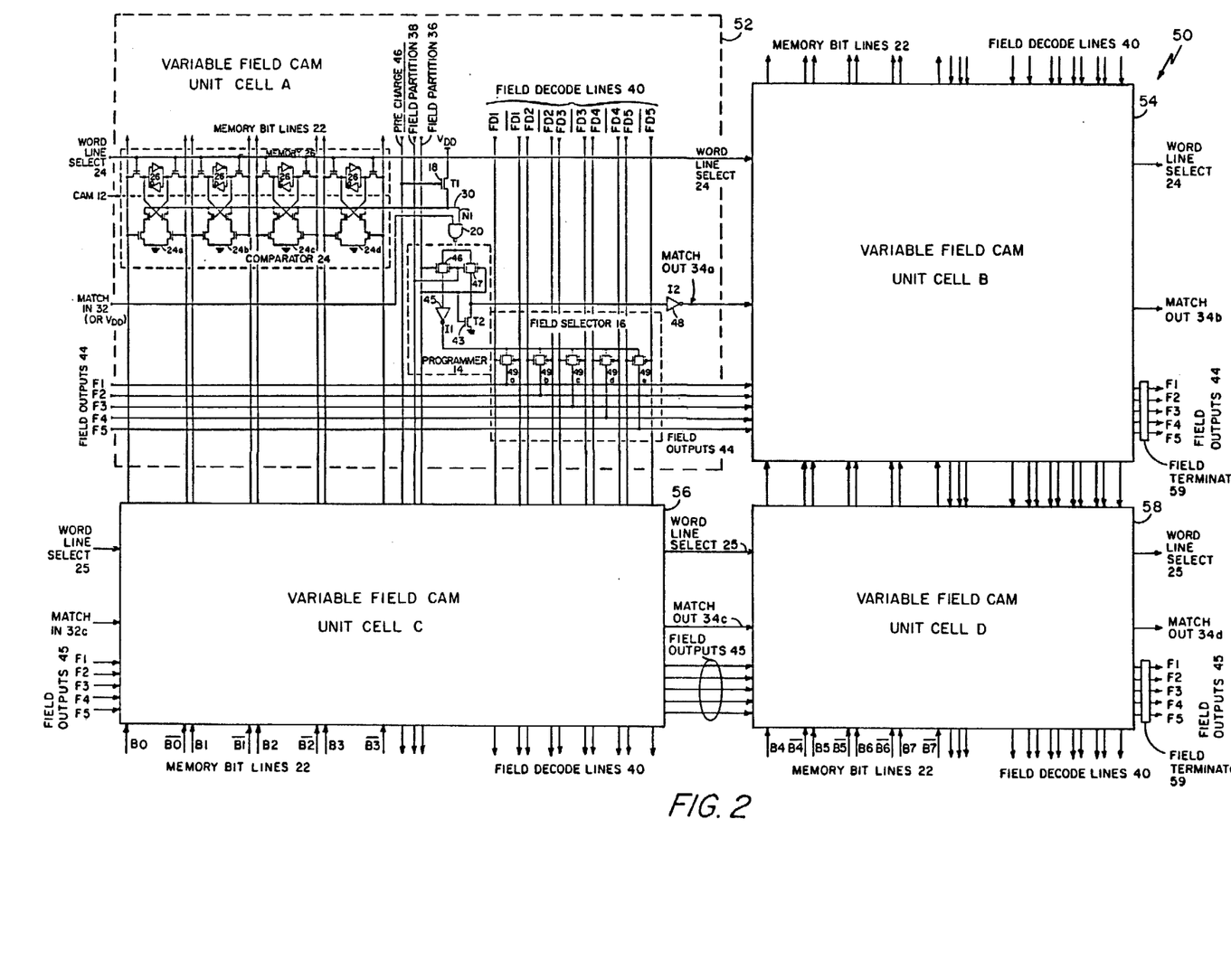
FIG. 2 is a block diagram of a 2×2 unit cell matrix employing the present invention showing the interconnections for a 2 word by 8 bit variable field CAM array.

Referring now to FIG. 1, there is shown a 4-bit variable field content addressable memory (VFCAM) unit cell 10 of the present invention comprising a content addressable memory (CAM) word segment 12, a programmer 14 and a field selector 16. A plurality of 4-bit unit cells 10 may be interconnected into a unit cell matrix forming a VFCAM array 50 of Y words by X-bits as shown in FIG. 2. Data is loaded into the 4-bit memory 26 portion of the CAM word segment 12 via memory bit lines 22 when a word line select 24 signal from a word address decoder is asserted. Data is provided on the memory bit lines 22 for comparison with the pre-stored data in the CAM word segment 12. The comparison is performed by four comparators 24a-24d coupled to 4-bit memory circuits 26a-26d respectively in the CAM word segment 12, and when all bits compare, coincidence or a match is achieved which is detected by a match NAND gate 20. The inputs to NAND gate 20 consist of the match signal on line 30 in the present unit cell and a Match In 32 signal from an adjacent cascaded unit cell. When there is no adjacent unit cell, then the Match In line 32 is connected to $V_{DD}$ in order to provide a constant logic 1. The output of NAND gate 20 is coupled to the programmer 14.

The programmer 14 determines the field size or number of bits in a field of a word. In accordance with the logic level of a field partition 36 signal (and its complement 38), the programmer 14 either partitions a field or cascades a field to the next unit cell. The output of the programmer 14 is coupled to the field selector 16 which selects the desired field output (F1 to F5) in accordance with the field decode 40 signals (FD1 to FD5) generated by a field decoder 64 shown in FIG. 4. A field size may vary in length from x bits to q bits in x bit increments and the number of fields within a word may be 1 to m. The unit cell 10 either provides a field of 4-bits (x=4) or it is a portion of a larger field comprising more than one cascaded unit cell. In addition, unit cell 10 may be part of a word having up to five fields (m=5). Although theoretically a unit cell may comprise any number of bits, the unit cell 10 provides an optimum embodiment for a unit cell having a minimum of overhead circuitry. The VFCAM unit cell 10 is embodied by a VLSI complementary metal oxide semiconductor (CMOS) chip designed by the present assignee using CMOS technology known to one skilled in the art.

Still referring to FIG. 1, when all four bits of data in CAM word segment 12 match to incoming data on the memory bit lines 22, then the logic level at the N1 input of NAND gate 20 is a logic 1 as precharged and maintains the logic 1 level. When one or more of the four bits of data do not match the incoming data, then the N1 input is at a logic 0. When the field partition 36 signal is a logic 0, the present field is extended to a next VFCAM unit cell. The results of the match at node N1 is transferred to the match out line 34 via NAND gate 20, transfer gate 47 and inverter 48 when the T2 transistor 43 is off as a result field partition 36 signal being a logic 0. If a match exists, the match out signal 34 is a logic 1, otherwise, it is a logic 0. The match out signal 34 connects to the match in input of the next adjacent cascaded unit cell as shown in FIG. 2. When the field partition 36 signal is a logic 1, then the field is terminated at the present unit cell. The result of a match at node N1 is forwarded to one of the field outputs 44 via transfer gate 46, inverter 45 and one of the field select transfer gates 49a-49e as determined by the field decode lines 40. In addition, the match out 34 becomes a logic 1 when transistor 43 is in the ON state as a result of the field partition 36 signal being a logic 1 which turns T2 ON; the drain of T2 goes to logic zero which is the input to inverter 48 thereby making match out 34 a logic 1. The beginning of a next field is then enabled.

Referring now to FIG. 2, the modular VFCAM unit cell 10 is shown being used four times to form a 2×2 matrix of a VFCAM array 50 having 2 words by 8 bits of storage and implemented with VFCAM-A 52, VFCAM-B 54, VFCAM-C 56, and VFCAM-D 58. The interconnections between the unit cells are shown in FIG. 2. The word line select 24 of VFCAM-A 52 connects to the same signal line at VFCAM-B 54. The match out 34a from VFCAM-A connects to a match in 34b line of VFCAM-B 54. The field outputs 44 connect to the same corresponding signal lines of VFCAM-B 54. The memory bit lines 22 of VFCAM-A 52 connect to the same signal lines of VFCAM-C 56. The field decode lines 40 of VFCAM-A 52 connect to the same signal lines of VFCAM-C 56. The precharge line 46 and the field partition lines 36, 38 connect to corresponding lines in VFCAM-C 56. The interconnections between VFCAM-B 54, VFCAM-C 56, and VFCAM-D 58 are similar to the interconnections for VFCAM-A 52, VFCAM-B 54, and VFCAM-C 56. VFCAM arrays of larger word capacity (Y) and greater bit length (X) are readily formed by adding to the unit cell matrix shown in FIG. 2 the desired number of additional VFCAM unit cells 10 vertically and horizontally.

Figure 3:
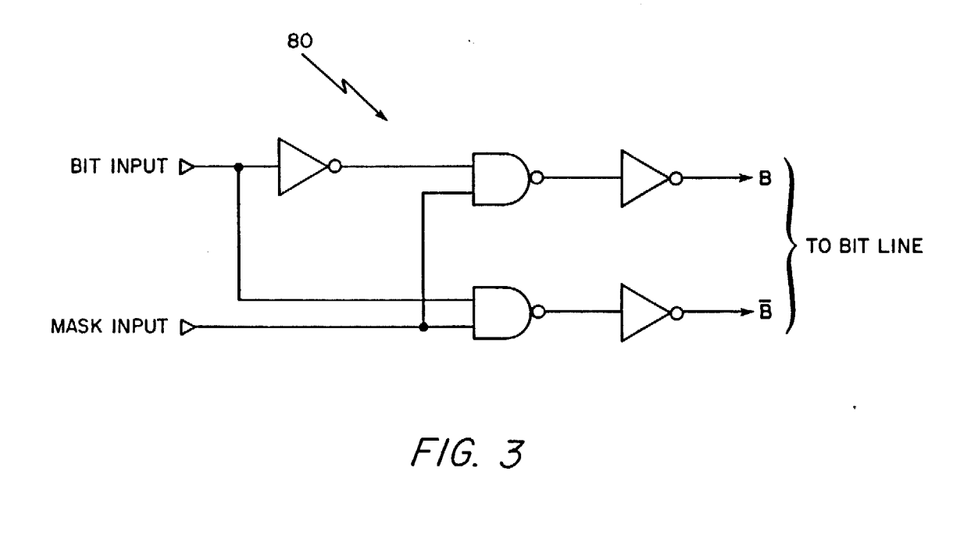
FIG. 3 is a schematic diagram of a bit masking logic circuit.

Referring now to FIG. 1 and FIG. 3, the VFCAM unit cell 10 as shown in FIG. 1 has the capability of being a restricted compare between limit memory (CBLM) by adding a bit masking circuit 80 as shown in FIG. 3 to each pair of B and $\overline{B}$ memory bit lines 22. The outputs B and $\overline{B}$ of the bit masking circuit 80 connect to a corresponding pair of memory bit lines 22 such as B and $\overline{B}$ shown in FIG. 1. For example, in a 4-bit VFCAM four bit masking circuits 80 would be connected to the memory bit lines 22 and if 3 bits are masked and MSB=0, a match occurs when an incoming signal is between 0 and 7; if MSB=1, a match occurs when an incoming signal is between 8 and 15. Table 1 shows the bracket ranges associated with each binary number of a 4-bit VFCAM when one, two, and three bits are masked.

TABLE 1

| MEMORY CONTENTS AND MASKED BIT(s) | | | | RANGE MATCH |
|---|---|---|---|---|
| MSB | | | | |
| 0 | 0 | 0 | X | 0 to 1 |
| 0 | 0 | 1 | X | 2 to 3 |
| 0 | 1 | 0 | X | 4 to 5 |
| 0 | 1 | 1 | X | 6 to 7 |

TABLE 1-continued

| MEMORY CONTENTS AND MASKED BIT(s) | | | | RANGE MATCH |
|---|---|---|---|---|
| 1 | 0 | 0 | X | 8 to 9 |
| 1 | 0 | 1 | X | 10 to 11 |
| 1 | 1 | 0 | X | 12 to 13 |
| 1 | 1 | 1 | X | 14 to 15 |
| 0 | 0 | X | X | 0 to 3 |
| 0 | 1 | X | X | 4 to 7 |
| 1 | 0 | X | X | 8 to 11 |
| 1 | 1 | X | X | 12 to 15 |
| 0 | X | X | X | 0 to 7 |
| 1 | X | X | X | 8 to 15 |

Figure 4:
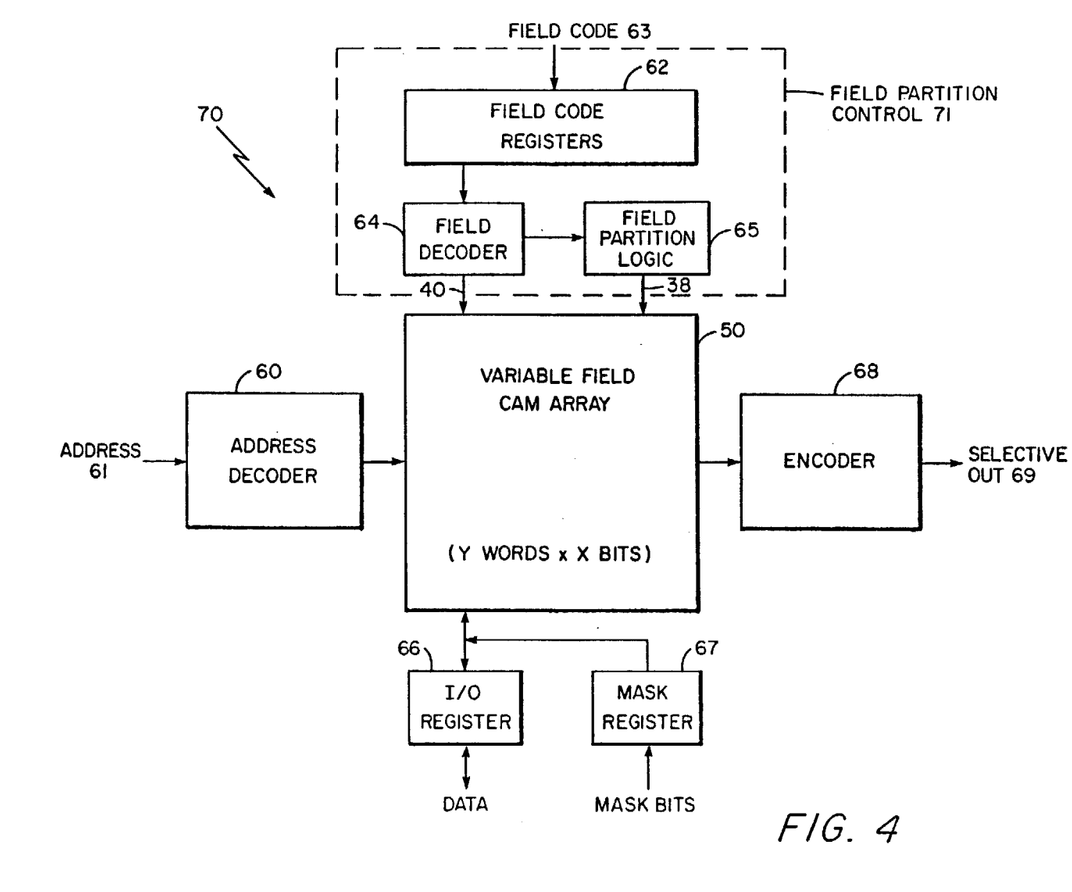
FIG. 4 is a block diagram of a preferred embodiment for a variable field CAM system of the present invention.

Referring now to FIG. 4, a block diagram of a programmable VFCAM system 70 is shown. An address decoder 60 decodes an address 61 for loading data into the addressed storage location of a VFCAM array 50 and for reading the loaded data. The VFCAM array 50 comprises Y words by X-bits of storage locations and may be implemented with a plurality of VFCAM unit cells 10 cascaded vertically and horizontally as illustrated in FIG. 2 which shows the interconnections for a 2 words by 8 bits VFCAM array. Field code registers 62 store a field code 63 control word for programming or specifying the identical fields within the Y word storage locations of the array 50. A field decoder 64 decodes the field code 63 control word and generates field decode signals 40 which in combination with field partition logic 65 selects one or more fields within a storage location for a data word. An encoder 68 coupled to the VFCAM array 50 output generates a selective out 69 signal which indicates that the status of any one or more fields within the VFCAM array 50. An I/O register 66 services data to be loaded into or read from the VFCAM array 50, or receives data to be compared with data stored in the VFCAM array 50. In addition, a mask register 67 couples mask bits to the memory bit lines 22 of the VFCAM array 50 via the bit masking logic circuit shown in FIG. 3 for performing mask operations. The operation of the VFCAM system 70 comprises the steps of:

1. loading data into storage circuits 26a–26d via the I/O register 66;
2. selecting the number of fields and the numbers of bits in a field with the programmable field partitions control 71 by loading a field code 63 word into the field code registers 62 thereby partitioning or setting the boundaries for one or more fields within a VFCAM storage location;
3. comparing in comparator 24 incoming data on memory bit lines 22 to the stored data in CAM 12 and generating a match out 34 signal when a comparison occurs for each field.
4. encoding the field outputs 44, 45, etc. on each search word in the encoder 68 for providing information on the contents of selected field outputs.

Figure 5:
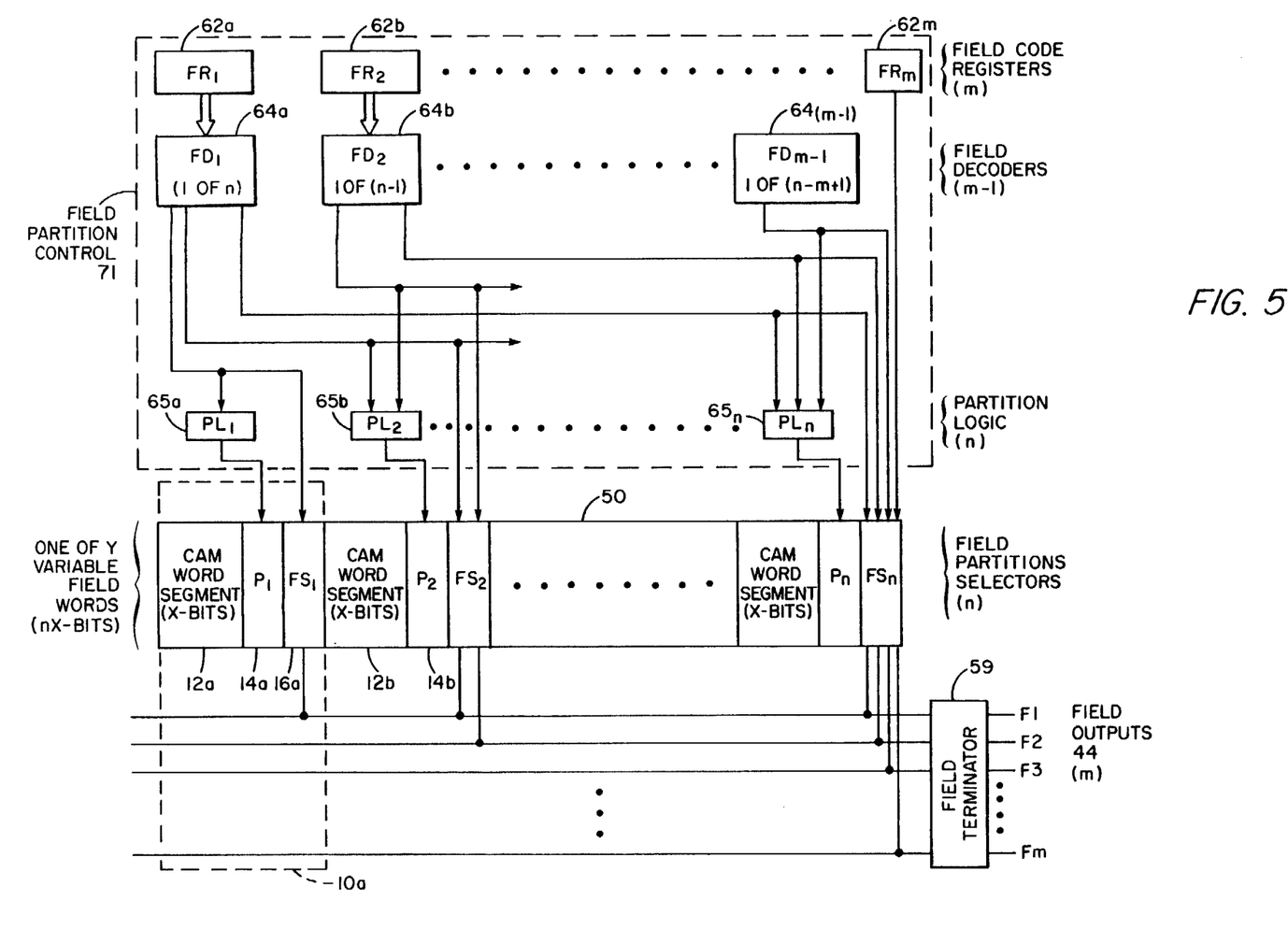
FIG. 5 is a generalized block diagram of the variable field control logic of the present invention.

Referring now to FIG. 4 and FIG. 5, FIG. 5 shows a detail block diagram of the field partition control 71 identified in the system diagram of FIG. 4. The programmable field partitioning of the VFCAM 50 is shown in FIG. 5 and the functional blocks of the control logic have been generalized so that any number of field outputs (m) 44 can be derived from an array of Y VFCAM words. Each VFCAM word has a total of n programmable partitions of CAM word segments each segment being x bits in width (where n is greater than or equal to m). The CAM word segments (12a, 12b, etc.) may be of different bit widths. In FIG. 5, a single VFCAM word has been segmented into n partitions of equal width for a total of nx bits.

Referring now to FIGS. 1, 4, and 5, the CAM word unit cell 10a in FIG. 5 corresponds to the 4-bit VFCAM unit cell 10 shown in FIG. 1, where the segment size x equals 4 and the number of fields m equals 5. The field partition control 71 comprises m field code registers 62a–62m, (m−1) field decoders 64a–64(m−1), and n partition logic elements 65a–65n. The field code registers 62a–62m store the field codes for specifying the bit width or partition size of each variable field in a VFCAM word. The field decoders 64a–64(m−1) in response to the field code registers 62a–62m select the specific field boundaries and corresponding field outputs 44 in an ordered sequence. The partition logic elements 65a–65n sample the status of the outputs of the field decoders 64a–64(m−1) that are feeding each CAM word unit cell 10a so that the programmer 14a, 14b, etc. can be enabled. In addition to the field partition control 71, each set of m field outputs 44 from the VFCAM words requires a field terminator 59. The field terminator 59 logic sets the state of the unused field outputs 44 when less than m fields are being used. Unused fields may be set to either a logic 1 state or a logic 0 state. If such terminator logic is not provided, the unused field outputs 44 will be undefined. For a specific VFCAM, the field configuration is established by determining the number of fields (n) in a variable field word of the VFCAM, the number of bits (x) or CAM word segments in each field, and the number of field outputs (m).

Still referring to FIG. 5, in general, each field selector, such as $FS_i$ within a VFCAM unit cell 10a will have n field select inputs and associated logic select circuits. FIGS. 1 and 2 illustrate an emodiment of the invention where the number of field outputs 44 equals 5. In the case of m outputs, the number of field code registers 62a–62m required is also equal to m. These field code registers 62a–62m are composed of one or more D-type Flip-Flops of bit length $a_i$ and store binary field codes 62a–62m such that the number of bits in a field code register is determined by knowing the number of boundaries desired. Therefore, $2a_i = n$, or $a_i \log 2 = \log n$; hence, $$a_i = \frac{\log n}{\log 2}$$

where n = number of boundaries where a specific field can be defined. If $a_i$ is a non-integer, then an integer of next higher value for $a_i$ is selected.

The field decoders 62a–62m are arranged in an ordered sequence starting with the first field (m = 1). Such first field may be placed in any of the n boundary locations. The number of bits in the first field register is determined by $$a_l = \frac{\log n}{\log 2}$$

For example, if n = 16, then $a_1 = 4$. However, if n = 20, then $a_1 = 4.32$, and the integer value of 5 is assigned for the number of bits in the field code register.

The second field (m = 2) now has a maximum number of assignable boundary locations of n − 1, since it is required to place the first field to the n = 1 boundary as a minimum. Then, $$\alpha_2 = \frac{\log (n - 1)}{\log 2}$$

This process of determining the sizes of the progressing $(n-1)$ field code registers 62a–62n continues until $n=(m-1)$, at which point $$\alpha_n = \frac{\log (n - m + 1)}{\log 2}$$

Each of such field code register outputs are the inputs to $(m-1)$ field decoders 64a–64(n−1) which provide the required combinatorial decoding to select 1 of n, 1 of $(n-1)$, ..., 1 of $(n-m+1)$ possible boundary locations for $(m-1)$ of the m fields. The last field, m, can only be placed in one position, that is the end boundary. Thus, the $FR_m$ field code register is ony one bit (one D-type Flip-Flop) and assumes the logic value "1" if an m field configuration is to be defined or the logic value "0" if any field configuration less than m is defined. Therefore, the $FR_m$ register provides an input directly to the $FS_n$ logic and does not have intermediate combinatorial selection logic.

In all cases when less than an m field configuration is selected, that field must be coincident with the last boundary and the highest order field output lines not selected must be terminated. The field code registers associated with these non-selected highest order fields must store a code (binary number) that does not produce a valid boundary selection from the corresponding Field Decoders. This is easily accomplished by setting these registers to all "zeros".

Figure 6:
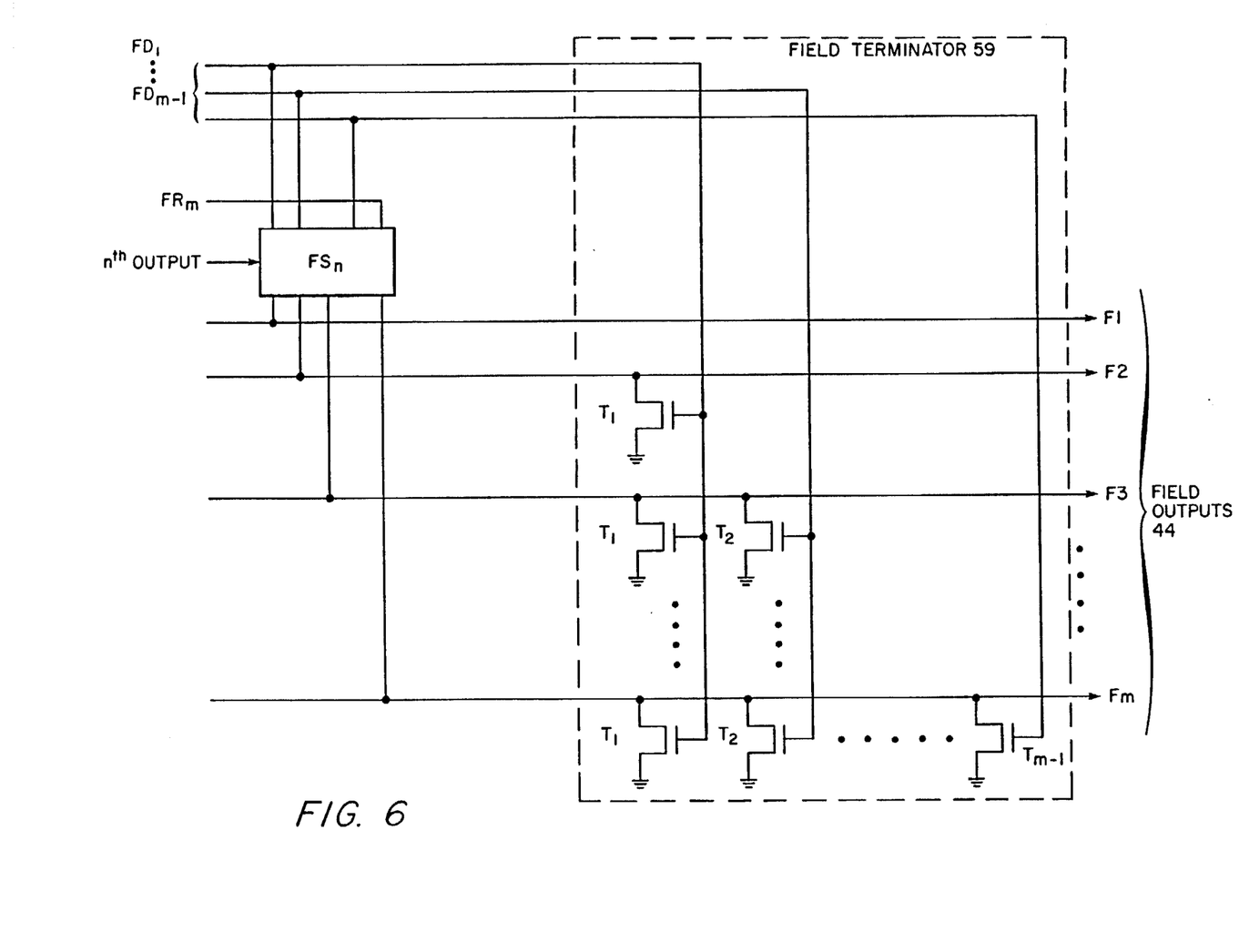
FIG. 6 is a schematic diagram of a field terminator for the field output signals.

The field terminator logic 59 is configured to set all unused field outputs to the logic "zero" state as shown in FIG. 6. This logic is positioned at the end of the nx VFCAM word. If only one field is selected, the $FD_1$ output feeding the $FS_n$ input is set to a logic "one" level while $FD_2$...$FD_{m-1}$ and $FR_m$ are set to a logic "zero". Thus, the entire nx VFCAM word contains only one field of data and its related output is placed on the $F_1$ output line through the $FS_n$ selector. As shown in FIG. 6, all higher order field output lines are terminated to ground through the $T_1$ transistors. If the full m field configuration is selected, then $FR_m$ is set to a logic "one" while $FD_1$...$FD_{m-1}$ feeding the $FS_n$ selector are set to the logic "zero" state. In this condition, field selections for $FD_1$, ..., $FD_{m-1}$ would have been made at previous $FS_i$ boundaries in sequential order. Note that all terminating transistors ($T_1$, $T_2$ ... $T_{n-1}$) remain in the "off" or non-conducting state. When less than m fields are selected, the highest order field is always placed at the output of the nx VFCAM word onto its respect field output line, ($F_i$ where i = 1 to m) while all unused outputs, $F_{i+1}$...$F_m$, are terminated to ground.

Referring again to FIG. 5, the partition logic 65a–65n samples the state of the inputs to the field selectors ($FS_i$ where i = 1 to n) to provide for a program logic input to the Programming Elements ($P_i$) 14a, 14b etc. Since only one unique field can be defined at any boundary this requires a simple "OR" logic function sampling the m inputs to the $FS_i$ field selectors at each boundary. However, some simplications can be incorporated in the $PL_i$ logic elements depending on their position. Since $FS_1$ can have only one selection, the first field, there is only one of the $FD_i$ (where i = 1 to $(m-1)$) signal lines (i.e. $FD_1$) feeding this boundary. Thus, $PL_1$ is a simple direct wire feedthrough. For $PL_2$, we require a 2-input "OR" function; for $PL_3$, a 3-input "OR" function; etc. up to $n = m$, at which point an m-input "OR" function is required. For all $P_i$ thereafter ($i \geq m$), an m-input "OR" function is required.

Figure 7:
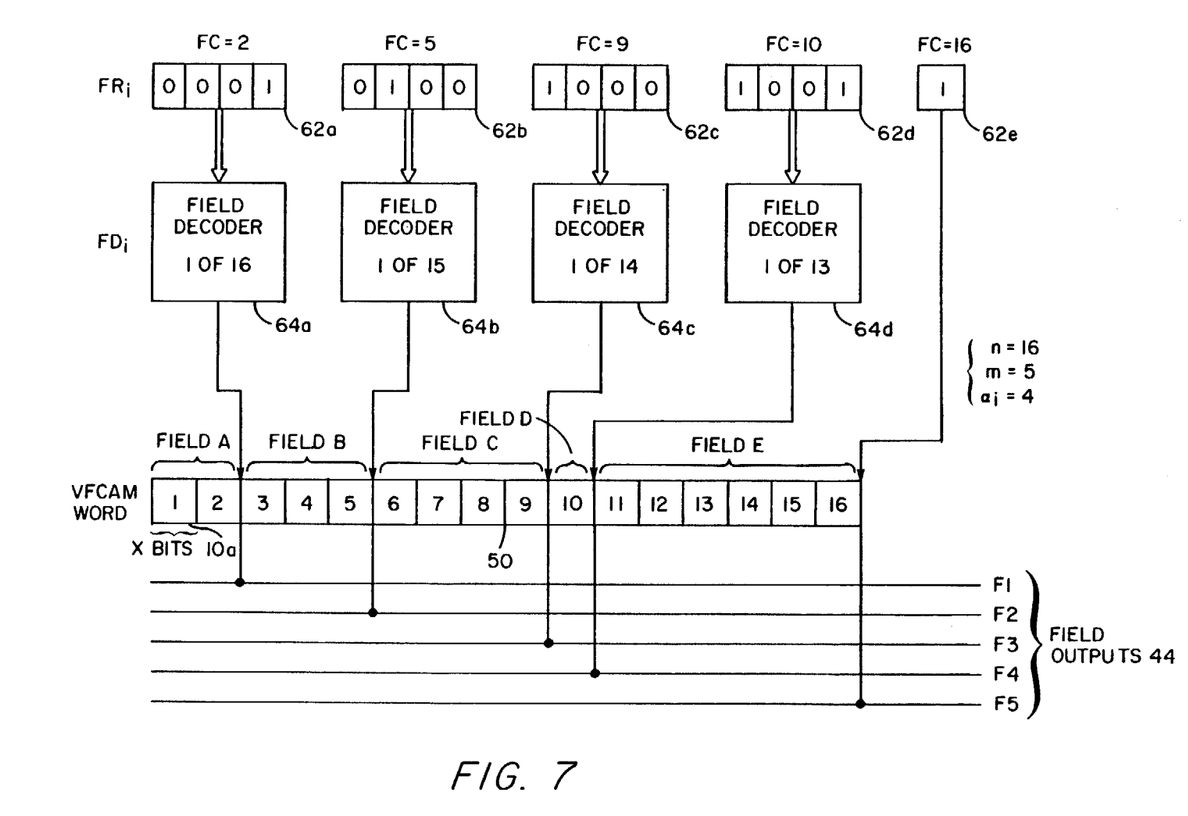
FIG. 7 illustrates an example of a VFCAM having 16 programmable partitions which are programmed for 5 fields in a VFCAM word storage location with 5 field outputs for monitoring each field.
Figure 8:
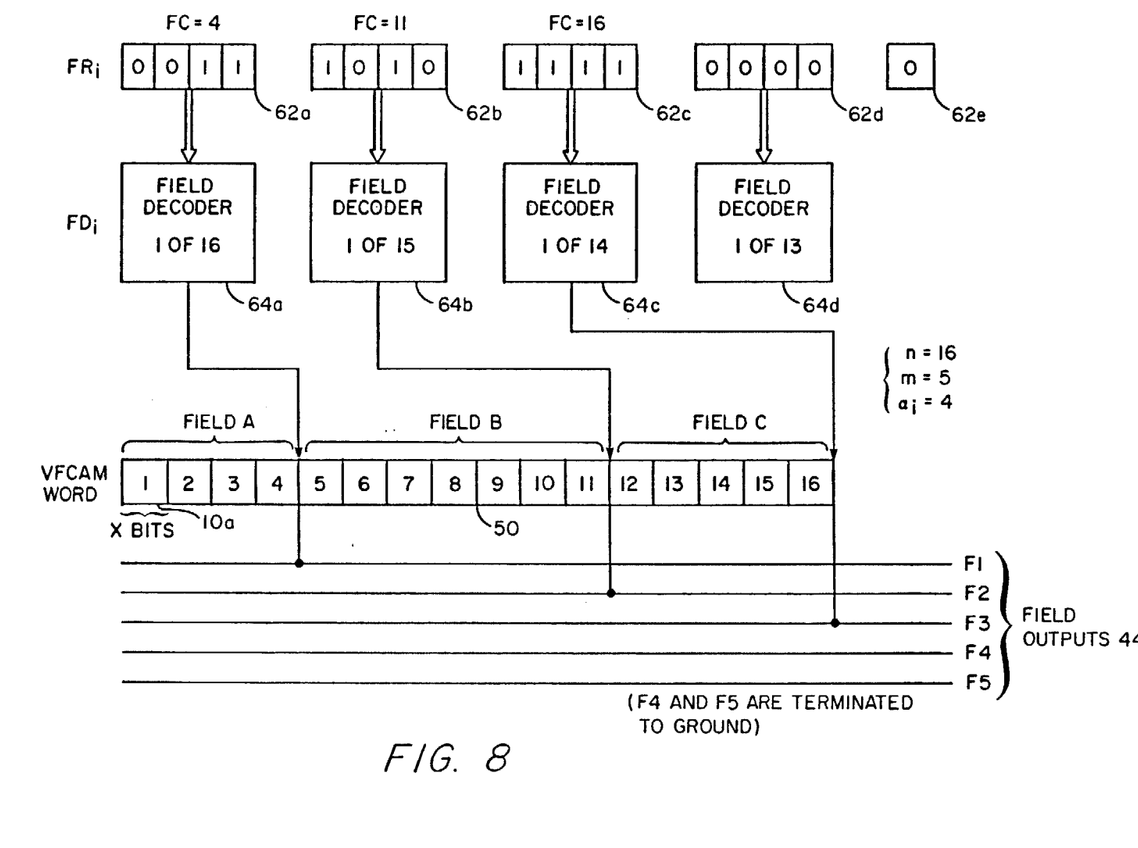
FIG. 8 illustrates an example of a VFCAM having 16 programmable partitions which are programmed for 3 fields in a VFCAM word storage location with 3 field outputs for monitoring each field although five field outputs are provided.

Two specific examples of field partitioning are shown in FIGS. 7 and 8 for $n=16$, $m=5$ and $\alpha_i=4$. The CAM word segments (12a to 12m) can be of any bit length. The field code (FC) loaded into the Field Code Registers $FR_i$ (where i = 1 to m) are selected from simple binary numbers which represent a field boundary location, as specified in Table 2.

TABLE 2

| Binary Field Code | $n^{th}$ Boundary |
|---|---|
| 0000 | 1 |
| 0001 | 2 |
| 0010 | 3 |
| 0011 | 4 |
| 0100 | 5 |
| 0101 | 6 |
| 0110 | 7 |
| 0111 | 8 |
| 1000 | 9 |
| 1001 | 10 |
| 1010 | 11 |
| 1101 | 12 |
| 1100 | 13 |
| 1101 | 14 |
| 1110 | 15 |
| 1111 | 16 |

In the example shown in FIG. 7, there are 16 programmable partitions (n = 16) and the VFCAM word has five fields (field A to field E) programmed by five field codes (FC) which are loaded into the field code registers ($FR_i$). Each of the fields has been programmed for a different total number of bits per field and the outputs F1 to F5 monitor each of the fields. The number of bits (x) in each VFCAM word segment is discretionary based on desired performance characteristics and efficient use of areas on a silicon chip; the VFCAM unit cell shown in FIG. 1 has 4 bits. In the example shown in FIG. 8, there are 16 programmable partitions (n = 16) and the VFCAM word has three fields (field A to field C) programmed by three field codes which are loaded into the field code registers $FR_i$. Each of the fields has been programmed for a different total number of bits per field and since there are only 3 fields but 5 field output lines, two of the output lines (F4 and F5) are terminated to ground by a terminator circuit as shown in FIG. 6.

This concludes the description of the preferred embodiment. However, many modifications and alterations will be obvious to one of ordinary skill in the art without departing from the spirit and scope of the inventive concept. For example, a VFCAM unit cell comprises one or more bits depending on design objectives and performance characteristics and a VFCAM array comprises a plurality of VFCAM unit cells depending on the size of the VFCAM array being implemented. Therefore, it is intended that the scope of this invention be limited only by the appended claims.

What is claimed is:

1. A variable field content addressable memory (VFCAM) cell comprising:
    memory means having at least one storage bit for storing a data word or a portion of said data word; each storage bit being coupled to a word select line and a data line;

means coupled to said memory means for determining the sizes of a plurality of independent fields in said memory means corresponding to independent fields in said data word in response to a field partition signal; and a field selector means coupled to said field size determining means for directing simultaneous match signals from said memory means to field output lines for each of said fields.

2. The VFCAM cell as recited in claim 1 wherein:
said memory means comprises a comparator means coupled to each storage bit for producing said match signal when each data line of a search word compares with a corresponding bit of said data word stored in said memory means.

3. The VFCAM cell as recited in claim 1 wherein:
said field size determining means comprises means for forwarding said match signal to an adjacent memory cell, when said adjacent memory cell comprises a portion of said field in response to said field partition signal.

4. A variable field content addressable memory (VFCAM) array comprising:
a plurality of VFCAM cells coupled together vertically and horizontally to form an array of Y words by X bits of memory storage locations;
each of said memory cells comprising:
  (a) a memory means having at least one storage bit for storing a data word or a portion of said data word, each storage bit being coupled to a word select line and a data line;
  (b) means coupled to said memory means for determining the sizes of a plurality of independent fields in said memory means corresponding to independent fields in said data word in response to a field partition signal; and
  (c) field selector means coupled to said field size determining means for directing simultaneous match signals from said memory means to field output lines for each of said fields and;
terminator means coupled to each field output line for setting each unused field output line to a known logic state.

5. The VFCAM array as recited in claim 4 wherein:
said memory means comprises a comparator means coupled to each storage bit for producing said match signal when each data line of a search word compares with a corresponding bit of said data word stored in said memory means.

6. The VFCAM cell as recited in claim 4 wherein:
said field size determining means comprises means for forwarding said match signal to an adjacent memory cell, when said adjacent memory cell comprises a portion of said field in response to said field partition signal.

7. A variable field content addressable memory (VFCAM) system comprising:
memory array means for storing a plurality of data words in storage locations, each of said storage locations having the same partitioning for one or more fields, said fields corresponding to fields of said data words;
address decoder means coupled to said memory array means for accessing each of said storage locations in said memory array means in response to an address input;
means for transferring data to and from said memory array means in accordance with said address input;

field partition means coupled to said memory array means for selecting the number of fields in each of said storage locations of said array means and the number of bits in each of said fields in response to a field code; and encoding means coupled to an output of said memory array means for generating an address for each of said fields within said stored data words.

8. The VFCAM system as recited in claim 7 wherein:
said system comprises means coupled to said transferring means for masking one or more bits of said data being transferred to said memory array means.

9. The VFCAM system as recited in claim 7 wherein:
said memory array means comprises a plurality of memory cells coupled together vertically and horizontally to form an array of Y words by X bits of said memory storage locations.

10. The VFCAM system as recited in claim 9 wherein:
each of said memory cells comprises means for determining the size of each one of said fields within said storage locations in response to a field partition signal from said field partition means.

11. The VFCAM system as recited in claim 10 wherein:
each of said memory cells comprises field selector means coupled to said field size determining means for directing a match signal generated within said memory cells to a field output line, in response to field decode signals generated by said field partition means.

12. The VFCAM system as recited in claim 11 wherein:
each of said memory cells comprises a comparator means coupled to each storage bit within said memory cell for producing said match signal when each data line of a search word compares with a corresponding bit of said data word stored in said memory means.

13. A method of programming a variable field content addressable memory system comprising the steps of:
transferring data to and from a memory array means in accordance with an address input;
storing a plurality of data words in said memory array means of said memory system, said data words having fields corresponding to said memory system field partitioning;
selecting the same number of fields in each of said storage locations of said memory array means and the number of bits in each of said fields by a field partition means in response to a programmable field code; and
generating an address for each of said fields within said stored data words by encoding means coupled to an output of said memory array means.

14. A variable field content addressable memory (VFCAM) cell comprising:
memory means having at least one storage bit for storing a data word or a portion of said data word, each storage bit being coupled to a word select line and a data line;
means coupled to said memory means for determining the size of at least one field or a portion of said field in said memory means corresponding to a field in said data word in response to a field partition signal, said field size determining means comprising means for forwarding said match signal to an adjacent memory cell, when said adjacent memory cell comprises a portion of said field in response to said field partition signal; and a field selector means coupled to said field size determining means for directing a match signal from said memory means to a field output line in response to field decode signals.

* * * * *